United States Patent [19]

Weisbrod

[11] 4,326,151
[45] Apr. 20, 1982

[54] SCANNING WAVEFORM GENERATOR FOR FLAT PANEL DISPLAY DEVICES

[75] Inventor: Sherman Weisbrod, Somerville, N.J.

[73] Assignee: RCA Corporation, New York, N.Y.

[21] Appl. No.: 216,908

[22] Filed: Dec. 16, 1980

[51] Int. Cl.³ .............................................. H01J 29/74
[52] U.S. Cl. .................................... 315/410; 315/366
[58] Field of Search ............... 315/366, 408, 409, 410; 313/422

[56] References Cited

U.S. PATENT DOCUMENTS 2,799,784  7/1957  Harris et al. .
2,863,069  12/1958  Campanella .
2,900,502  8/1959  Kuehn et al. .

Primary Examiner—Theodore M. Blum
Attorney, Agent, or Firm—Eugene M. Whitacre; Dennis H. Irlbeck; Lester L. Hallacher

[57] ABSTRACT

A triangular waveform generator for applying a scanning waveform to the scan electrodes of a modular display device includes a constant current source and a coupling transformer. A charge storage capacitor is coupled to the secondary of the coupling transformer. A squarewave generator actuates a switch to alternately charge the capacitor in opposite directions resulting in the generation of the triangular waveform. Discharge means is provided to protect the switch from high voltages which could be developed when the generator is turned off.

15 Claims, 3 Drawing Figures

SCANNING WAVEFORM GENERATOR FOR FLAT PANEL DISPLAY DEVICES

BACKGROUND OF THE INVENTION

This invention relates generally to modular flat panel display devices and particularly to a waveform generator for generating a triangular scanning waveform in such devices.

A modular flat panel display device in which the instant invention can be utilized is described in U.S. Pat. No. 4,117,368 issued to F. J. Marlowe, et. al. The Marlowe device consists of an evacuated envelope which is divided into channels by a plurality of vanes. Each of the channels include guide meshes for propagating electron beams along the lengths of the channels. When a particular line of the visual display is to be produced, the electron beams are ejected from the guide meshes and travel toward the display screen. The vanes support deflection electrodes which are biased with varying deflection potentials. These deflections potentials cause the electrons traveling from the guide meshes to the display screen to be scanned transversely across the channels. The electron beams of all the channels are simultaneously ejected from between the guide meshes so that a portion of the same horizontal line of the visual display is simultaneously generated across each of the channels. In order to avoid charging the capacitor formed by the deflection electrodes on opposite sides of a vane, the same deflection voltage is applied to both deflection electrodes. Adjacent channels, therefore, are scanned in opposite directions. Video information, therefore, must also be supplied to adjacent channels in reverse order.

A system which reverses the order of data supplied to adjacent channels of a modular display device is described in U.S. Pat. No. 4,080,630 issued to F. J. Marlowe. In the Marlowe system, the incoming video data are in analog form and are digitized in an analog-to-digital (A/D) converter. The digitized output of the A/D converter is supplied to a reversing register which includes two shift registers. The two shift registers are coupled through switching means to a primary shift register so that either of the shift registers can load the primary shift register. When the switching means is coupled to one of the registers, the data are read out of the primary register in the same order as received. When the switching means are coupled to the other shift register, the data are read out of the primary register in an order reversed from the received order.

U.S. Pat. No. 4,257,068 issued to L. B. Johnston also shows a system which reverses the order of data supplied to adjacent channels of a modular display device. The Johnston system replaces the two shift registers of Marlowe with a left/right shift register.

The instant invention is directed to a triangular waveform generator which can be used to scan the channels of the device described in U.S. Pat. No. 4,117,368 and which can be used in conjunction with the devices described in U.S. Pat. Nos. 4,080,630 and 4,257,068.

SUMMARY OF THE INVENTION

A triangular waveform generator for a modular electron display device in which scanning electrodes are biased to cause transverse scanning of the modules includes a power supply and a constant current source coupled to the scanning electrodes. A charge storage means is responsive to the constant current source and biases the scanning electrodes. Switching means receive a switching signal to alternately connect the constant current source to the charge storage means in opposite directions. Unidirectional conducting means block current flow as the switching means changes directions. Discharge means discharges the charge storage means when the current stops flowing in the generator.

DETAILED DESCRIPTION OF THE PREFERRED EMBODIMENT

Figure 1:
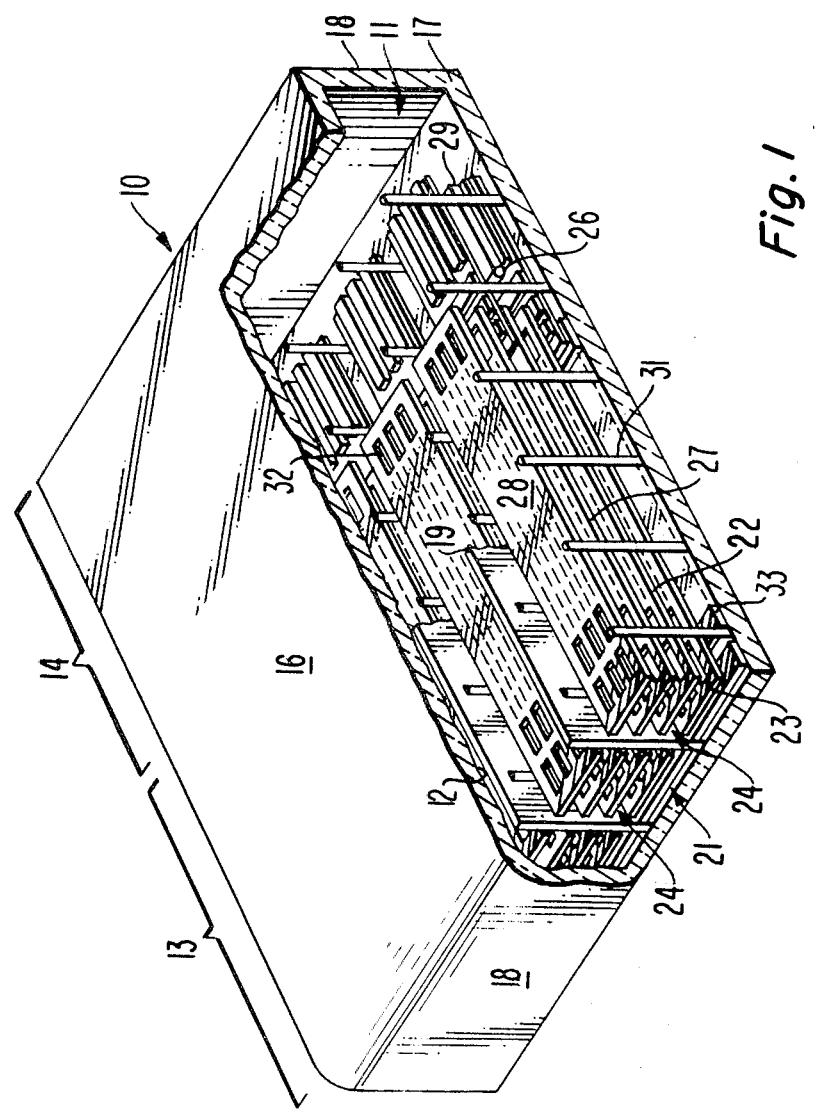
FIG. 1 is a partial cutaway perspective view of a prior art modular display device in which the invention can be employed.

FIG. 1, a flat panel display device 10 in which the preferred embodiment can be utilized includes an evacuated envelope 11 having a display section 13 and an electron gun section 14. The envelope 11 includes a faceplate 16 and a baseplate 17 held in a spaced parallel relationship by sidewalls 18. A display screen 12 is positioned along the faceplate 16 and gives a visual output when struck by electrons.

A plurality of spaced parallel support vanes 19 is arranged between the front wall 16 and the baseplate 17 to provide the desired internal support against external atmospheric pressure and to divide the envelope 11 into a plurality of channels 21. A beam guide assembly, including spaced parallel beam guide meshes 22 and 23, a focus mesh 27, and an acceleration mesh 28 extends transversely across and longitudinally along each of the channels 21. A line cathode 26 is supported by a cathode support 29 and is arranged to emit electrons into the spaces 24 between the guide meshes 22 and 23 in each channel 21 so that the electrons propagate the lengths of the channels. The channels 21 each include an electron gun for the three colors used to produce a color display. The electron guns include a portion of the line cathode and electrodes which are biased to cause electrons to enter the spaces 24. Each of the meshes 22, 23, 27 and 28 contain a plurality of apertures 32, which are arranged in columns longitudinally along the meshes and in rows transversely across the meshes. Disposed on the inside surface of the back plate 17 is a plurality of extraction electrodes 33, which extend transversely across the entire transverse dimension of the envelope 11. When a particular line of the visual display is to be printed on the display screen 12, a negative voltage is applied to one of the extraction electrodes 33 so that the electrons are ejected from between the guide meshes 22 and 23 of every channel and travel to the screen 12 to produce one line of the visual display. The vanes 19 support scanning electrodes (not shown) which are biased with a varying voltage to cause the electron beams to be scanned transversely across each of the channels. Accordingly, each of the channels 21 contributes to the entire line of the visual dislay.

The scanning electrodes of the display device shown in FIG. 1 and also that described in U.S. Pat. No. 4,117,368 can be scanned utilizing either a sawtooth waveform or a triangular waveform. When a sawtooth waveform is used, a linearly increasing voltage ramp is applied to the scanning electrodes until the electron beam is completely scanned across each of the channels. The increasing ramp is followed by a rapid return of the voltage to the lowest level and the increasing ramp again repeated. When triangular scanning is utilized, a linearly rising ramp is followed by a linearly falling ramp and the increasing and decreasing ramps have the same slope. Accordingly, both the increasing and decreasing ramps can be used to scan the electrodes. Scanning, utilizing a triangular waveform, is preferable to that utilizing a sawtooth waveform because a decrease in power consumption in the order of a factor of eight is realized. The decreased power consumption is founded upon several phenomena. Firstly, resistance losses are proportionate to current squared and therefore the high peak current associated with the rapid discharge of the scan capacitance during rapid retrace is undesirable. The triangular waveform eliminates the rapid flyback resulting in a power savings of a factor of four. Secondly, the fundamental frequency of the triangular waveform is one-half that of the sawtooth fundamental frequency. The transformer core losses are proportional to frequency squared and accordingly a factor of four savings in these losses is realized with the triangular waveform. The use of the triangular waveform therefore results in savings of a factor of four is both the resistance losses and the transformer core losses resulting in a total net saving of a factor of eight.

Figure 2:
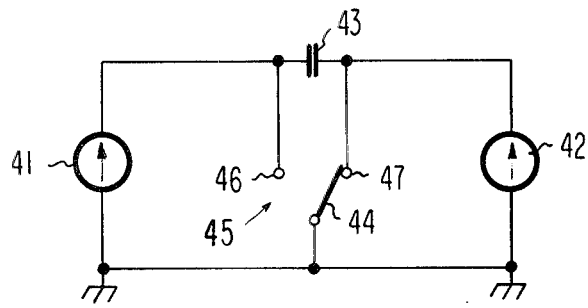
FIG. 2 is a simplified circuit showing how a triangular waveform is generated using constant current sources, a switch and a capacitor.

FIG. 2 is a simplified circuit showing how a triangular waveform can be generated. The circuit includes two constant current sources 41 and 42 arranged on opposite sides of a capacitor 43. A switch 45 includes two terminals 46 and 47 which also are arranged on opposite sides of the capacitor 43. Because the current sources 41 and 42 are constant after switch 45 is closed, the voltage across capacitor 43 is a linear function of time as defined by:

$$dv = (i/c)dt \qquad (1)$$

The circuit produces a linear symmetrical triangular waveform when the time that arm 44 is in contact with terminal 46 is equal to the time that the arm is in contact with terminal 47. The voltage across capacitor 43, measured at terminal 46 with respect to terminal 47, increases when the arm is in contact with terminal 47 and decreases when the arm is in contact with terminal 46.

Figure 3:
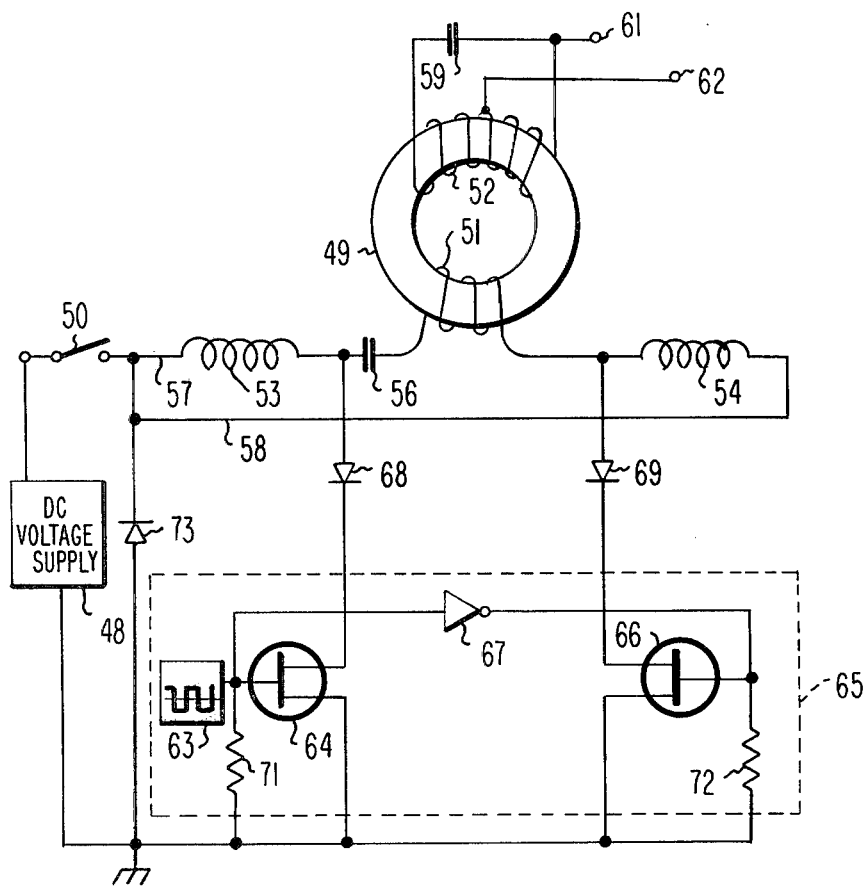
FIG. 3 is a preferred embodiment of the inventive triangular waveform generator.

The preferred embodiment of FIG. 3 includes a dc voltage supply 48 and a coupling transformer 49. The coupling transformer 49, which is shown as a toroid transformer, includes a primary 51 and a secondary 52 wound such that the secondary 52 has approximately four times as many turns as the primary 51. The output terminals 61 and 62 of the secondary 52 are connected to the scanning electrodes of the display device and a capacitor 59 represents the capacitance of those electrodes and preferably is used in lieu of the capacitor 13 of FIG. 1.

Two inductors 53 and 54 are connected on opposite sides of the primary 51 and have a sufficiently high inductance so that a dc power supply 48 in conjunction with the inductors 55 and 54 serve as a constant current source. A dc blocking capacitor 56 in connected between the inductors 55 and 54 in series with the primary 51. The inductors 53 and 54 are both connected to a switch 50 by way of leads 57 and 58, respectively, so that current can flow through the primary 51 in either direction depending upon the state of a switch 65 to thereby charge the capacitor 59 in opposite directions.

The switch 65 includes a squarewave generator 63 and two electron control devices 64 and 66, which can be either field effect transistors (FET) as shown or PNP or NPN transistors. The output of the squarewave generator 63 is connected directly to the control electrode of the FET 64 and is connected to the control electrode of the FET 66 through an inverter 67. The FET 64 is connected to one side of the transformer 49 through a diode 68. The FET 66 is connected to the other side of the transformer 49 through a similar diode 69. The diodes 68 and 69 are fast recovery diodes and prevent the switching FET's 64 and 66 from going negative when the FET's are turned off. The control electrodes of the FET's 64 and 66 are connected to ground through biasing resistors 71 and 72, respectively.

The squarewave generator 63 is connected to the control electrodes of both the FET's 64 and 66. However, because of the presence of the inverter 67, the FET's 64 and 66 are alternately conductive and nonconductive. The switch 65 therefore serves the function of the switch 14 of FIG. 2 so that the capacitor 59 is alternately charged in opposite directions to therefore generate the desired linear triangular waveform. The polarity changes of the squarewave output of the generator 63 determines the switching of the FET's 64 and 66 and therefore therepetition rate of the squarewave determines the time duration of the ramps of the resulting triangular waveform. When the output waveform of the generator 63 is symmetrical, there is no dc component of the waveform and the blocking capacitor 56 can be eliminated.

The scanning triangular waveform is applied to the scan electrodes over the terminals 61 and 62 and can be stopped by opening the switch 50. However, a problem can arise because the energy stored in magnetic fields of the inductors 55 or 54 cannot be instantaneously discharged. Accordingly, the same current exists immediately after switching as existed immediately before switching. That is, the current (i) after switch 50 is open:

$$i = (E/R)e - Rt/L \qquad (2)$$

Solving for the voltage:

$$E = iR/e - Rt/L \qquad (3)$$

When the switch 50 is open, the resistance R is very large so that the voltage E is also very large. This voltage can destroy either the diodes 68 and 69 or the FET's 64 and 66. This damage is prevented by connecting a discharge diode 73 between the switch 50 and ground. The diode 73 does not conduct when the switch 50 is closed and capacitance 59 is charging. However, when the voltage is turned off by opening the switch 50, the diode 73 conducts so that the R in equation (3) is very small, resulting in a low voltage which does not damage either the diodes 68 and 69 or the transistors 64 and 66.

What is claimed is:

1. In an electron display device having a plurality of internal support walls dividing said display device into a plurality of channels and including scanning electrodes for transversely scanning electron beams across said channels, a waveform generator for applying a triangular waveform to said scanning electrodes comprising:

a power supply including a constant current source;

means for coupling said power supply to said scanning electrodes;

charge storage means responsive to said constant current source;

means for providing a switching signal having alternate positive and negative polarities;

switching means responsive to said switching signal for alternately connecting said constant current source to said means for coupling means in opposite directions in response to said positive and negative polarities;

unidirectional conducting means between said switching means and said means for coupling for blocking current flow as said switching means changes polarities; and means for discharging said means for coupling and said charge storage means in response to disconnection of said constant current source from said means for coupling.

2. The generator of claim 1 wherein said means for coupling is a transformer.

3. The generator of claim 2 wherein said switching means includes first and second voltage responsive electron control means individually responsive to said positive and negative polarities.

4. The generator of claim 3 wherein said unidirectional conducting means comprise diodes individually arranged between said first and second electron control means and said transformer.

5. The generator of claim 4 wherein said first and second electron control means are solid state devices.

6. The generator of claim 5 wherein said solid state devices are Field Effect transistors.

7. The generator of claim 6 wherein said constant current source includes a direct current voltage supply and a plurality of inductors arranged on opposite sides of said means for coupling, and wherein said charge storage means is the capacitance of said scanning electrodes.

8. The generator of claim 7 wherein said means for discharging is a diode arranged between said voltage supply and ground.

9. The generator of claim 1 wherein said constant current source includes a direct current voltage supply and a plurality of inductors arranged on opposite sides of said means for coupling and wherein said charge storage means is the capacitance of the scanning electrodes.

10. The generator of claim 9 wherein said switching signal is a squarewave.

11. The generator of claim 10 wherein said switching means includes a pair of substantially identical voltage responsive electron control means arranged between opposite sides of said means for coupling and ground and wherein said unidirectional conducting means includes a pair of diodes individually arranged between said electron control means and said means for coupling.

12. The generator of claim 11 wherein said means for discharging includes a diode arranged between said voltage supply and ground.

13. The generator of claim 12 wherein said electron control means are Field Effect transistors and wherein said squarewave is applied to the control electrode of said transistors.

14. The generator of claim 13 further including signal inverting means arranged between said means for providing a switching signal and one of said transistors.

15. The generator of claim 14 wherein said means for coupling includes a toroid coil.

* * * * *